United States Patent
Steiger et al.

(10) Patent No.: US 9,978,591 B2
(45) Date of Patent: May 22, 2018

(54) FORMULATIONS COMPRISING AMMONIACAL HYDROXOZINC COMPOUNDS

(71) Applicants: Juergen Steiger, Taipei (TW); Duy Vu Pham, Oberhausen (DE); Dennis Weber, Dortmund (DE); Silviu Botnaras, Hannover (DE)

(72) Inventors: Juergen Steiger, Taipei (TW); Duy Vu Pham, Oberhausen (DE); Dennis Weber, Dortmund (DE); Silviu Botnaras, Hannover (DE)

(73) Assignee: EVONIK DEGUSSA GMBH, Essen (DE)

( * ) Notice: Subject to any disclaimer, the term of this patent is extended or adjusted under 35 U.S.C. 154(b) by 159 days.

(21) Appl. No.: 14/395,339

(22) PCT Filed: Mar. 26, 2013

(86) PCT No.: PCT/EP2013/056341
§ 371 (c)(1),
(2) Date: Oct. 17, 2014

(87) PCT Pub. No.: WO2013/156274
PCT Pub. Date: Oct. 24, 2013

(65) Prior Publication Data
US 2015/0076421 A1    Mar. 19, 2015

(30) Foreign Application Priority Data
Apr. 17, 2012 (DE) .................. 10 2012 206 234

(51) Int. Cl.
| H01L 21/02 | (2006.01) |
| H01L 29/24 | (2006.01) |
| H01L 29/786 | (2006.01) |
| H01B 1/06 | (2006.01) |
| H01B 1/22 | (2006.01) |

(52) U.S. Cl.
CPC ......... *H01L 21/02565* (2013.01); *H01B 1/06* (2013.01); *H01B 1/22* (2013.01); *H01L 21/02554* (2013.01); *H01L 21/02628* (2013.01); *H01L 29/24* (2013.01); *H01L 29/7869* (2013.01)

(58) Field of Classification Search
None
See application file for complete search history.

(56) References Cited

U.S. PATENT DOCUMENTS

| 2006/0286737 A1* | 12/2006 | Levy ............... B82Y 10/00 438/199 |
| 2007/0287221 A1 | 12/2007 | Ong et al. |
| 2008/0023698 A1 | 1/2008 | Li et al. |
| 2010/0144088 A1 | 6/2010 | Oh et al. |
| 2011/0193084 A1 | 8/2011 | Thiem et al. |
| 2012/0043537 A1* | 2/2012 | Karpov ............... C23C 18/1216 257/43 |
| 2012/0086002 A1 | 4/2012 | Fleischhaker et al. |
| 2013/0277672 A1 | 10/2013 | Sano et al. |

FOREIGN PATENT DOCUMENTS

| JP | 2010-18479 | 1/2010 | |
| JP | 2010-132545 | 6/2010 | |
| RU | 2 402 106 C2 | 10/2010 | |
| SU | 897052 | 5/1984 | |
| WO | WO 2010125011 A2 * | 11/2010 | ......... C23C 18/1216 |
| WO | WO 2010/146053 A1 | 12/2010 | |

OTHER PUBLICATIONS

U.S. Appl. No. 13/123,072, filed Apr. 7, 2011, US2011/0193084 A1, Thiem, et al.
Friederike Fleischhaker, et al., "ZnO based field-effect transistors (FETs): solution-processable at low temperatures on flexible substrates" Journal of Materials Chemistry, vol. 20, XP009171790, Jul. 12, 2010, pp. 6622-6625.
Stephen T. Meyers, et al., "Aqueous Inorganic Ink for Low-Temperature Fabrication of ZnO TFTs" Journal of the American Chemical Society, vol. 130, No. 51, XP002617673, Mar. 12, 2008, pp. 17603-17609.
Jaechul Park, et al., "Source/Drain Series-Resistance Effects in Amorphous Gallium-Indium Zinc-Oxide Thin Film Transistors" IEEE Electron Device Letters, vol. 29, No. 8, Aug. 2008, pp. 879-881.
Taehwan Jun, et al., "Bias stress stable aqueous solution derived Y-doped ZnO thin film transistors" Journal of Materials Chemistry, vol. 21, 2011, pp. 13524-13529.
Notification of Reasons for Refusal dated Feb. 13, 2017, in Japanese Patent Application No. 2015-506162 filed Mar. 26, 2013 (with English translation).
Office Action dated Mar. 27, 2017, in Russian Patent Application No. 2014145777/05(073786) filed Mar. 26, 2013.
Russian Search Report dated Mar. 24, 2017, in Russian Patent Application No. 2014145777/05(073786) filed Mar. 26, 2013.

* cited by examiner

*Primary Examiner* — Katie L Hammer
(74) *Attorney, Agent, or Firm* — Grüneberg and Myers PLLC

(57) ABSTRACT

The invention relates to ammoniacal formulations comprising a) at least one hydroxozinc compound and b) at least one compound of an element of the $3^{rd}$ primary group, to the use thereof, to a method using said formulations to produce layers comprising ZnO and to electronic components produced using same.

8 Claims, No Drawings

FORMULATIONS COMPRISING AMMONIACAL HYDROXOZINC COMPOUNDS

The present invention relates to ammoniacal formulations comprising hydroxozinc compounds, to processes for producing ZnO-containing layers in which these formulations are used, to the ZnO-containing layers obtainable by this process, to the use of the formulations for production of electronic components, and to electronic components comprising the ZnO-containing layers produced by the process.

Owing to low production costs and easy scaleability, printed electronics are at the focus of many current research and development projects, especially in the field of semiconductor technology. An electronic circuit is inconceivable without field-effect transistors (FETs), which, in the case of printed electronics, can be classified as thin-film field-effect transistors (TFTs).

An important component in every transistor is the semiconductor material, which influences the switching parameters, for example the voltage. Important parameters for semiconductor materials are the respective field-effect mobilities, processabilities and processing temperatures in the course of production.

Owing to its properties, which are similar to those of gallium nitride, and owing to its simple and inexpensive production, zinc oxide is one of the most attractive inorganic oxide materials for transistor production. In addition, zinc oxide, owing to the high interest in its piezoelectric and electromechanical properties, is also often used in semiconductor technology in general (Mater. Sci. Eng. B-Solid State Mater. Adv. Technol. 2001, 80, 383; IEEE Trans. Microw. Theory Tech. 1969, MT17, 957) and in electronics and optoelectronics. Owing to its band gap of 3.37 eV at room temperature (Klingshirn, Phys. Status Solidi B, 1975, 71, 547) and its high exciton binding energy of 60 meV (Landolt-Börnstein New Series, Group III Vol. 41 B), zinc oxide also has other widespread applications, such as in laser technology at room temperature.

The Hall mobility $\mu_H$ of the electrons in a Zno single crystal is 400 $cm^2 \cdot V^{-1} \cdot s^{-1}$, though these values have not been achieved to date in layers produced in practical experiments. Zno layers deposited or sputtered by epitaxy, i.e. by means of chemical vapour deposition (CVD), exhibit FET mobilities of 50 to 155 $cm^2 \cdot V^{-1} \cdot s^{-1}$.

The prior art further discloses layers based on mixed oxides comprising ZnO. For instance, Hosono, Journal of Non-Crystalline Solids, 2006, 352, 851-858 describes field-effect transistors which are obtained by means of gas phase deposition and have amorphous oxides of indium, gallium and zinc. Thus, not only pure ZnO layers but also ZnO-containing layers, i.e. layers comprising extraneous metals present in elemental or compound form (especially in oxidic form) alongside ZnO, may be suitable for use in field-effect transistors.

Mixed oxide transistors are also described elsewhere: Jeong et al., Adv. Mater. 2009, 21, 329-333 describes, for example, thin-film ZrInZnO transistors produced by means of co-sputtering. Park et al., Electrochemical and Solid-State Letters, 13 (9) H295-H297 (2010) describe thin-film Hf—ZnO transistors produced by means of magnetron sputtering. Lee et al. describe thin-film In—Ga—ZnO transistors produced by means of PECVD. However, a feature common to the processes for producing thin-film transistors described in these publications is that they require a high level of apparatus complexity and, for reasons including the production process, still do not lead to transistors having sufficiently good electrical properties.

Owing to the advantages of printing processes already mentioned, it would thus be desirable to be able to produce ZnO-containing layers with maximum charge carrier mobilities suitable for use in integrated circuits by means of printing processes.

A requirement on systems for printed electronics, which is not satisfied by most of the production technologies currently known for ZnO-containing layers, is the desired low processing temperature. This should be significantly below 300° C., even better below 200° C., in order to be suitable for flexible polymer-based substrates.

In principle, there are two ways of implementing printed electronics: particle concepts and precursor concepts.

Particle-based concepts rely particularly on the use of nanoparticulate systems, for example ZnO nanotubes (Nano Letters, 2005, 5, 12, 2408-2413). The disadvantages of the particle concepts lie firstly in the colloidal instability of the particle dispersions used, which necessitates the use of dispersing additives, which can in turn adversely affect the resulting charge carrier mobility. Moreover, particle-particle resistance is a problem, since this reduces the mobility of charge carriers and generally increases the layer resistance.

For the precursor approach, it is possible in principle to use various $Zn^{2+}$ salts for ZnO synthesis, for example $ZnCl_2$, $ZnBr_2$, $Zn(OAc)_2$, other Zn salts of carboxylic acids, $Zn(NO_3)_2$ and $Zn(SO_4)_2$. In spite of the resulting good mobility values, such precursors, however, are unsuitable for printable electronics because the processing temperature is always well above 350° C. (see, for example, J. Am. Chem. Soc. 2007, 129, 2750-2751 for the decomposition of $Zn(OAc)_2$ or IEEE Trans., 54, 6, 2007, 1301-1307 for the decomposition of $ZnCl_2$). Use of chelate ligands, for example, can reduce the processing temperature, but the use thereof is found to be disadvantageous for the resulting layers (DE 20 2005 010 697 U1). In contrast to the zinc salts listed, the dialkylzinc compounds available industrially in a simple manner, for example $Me_2Zn$ and $Et_2Zn$, are very reactive. Specifically for this reason, however, processing with them is very complex, and so there is a need for other ZnO precursors of good suitability for printable electronics.

Keszler et al., J. Am. Chem. Soc. 2008, 130, 17603-17609 describe readily processable ammoniacal solutions of zinc hydroxide compounds in which a Zn-ammine-hydroxo complex of the generic formula $Zn(OH)_x(NH_3)_y^{(2-x)+}$ is formed, this being preparable by means of a basic precipitation from zinc nitrate solutions and subsequent dissolution of the resulting precipitate in ammoniacal water. These can be used to produce ZnO-containing layers at temperatures from approx. 150° C. Good field-effect mobilities and switch-on voltages, and good hysteresis characteristics which make these layers suitable for use in field-effect transistors, result, however, only at a conversion temperature of at least 300° C. These high conversion temperatures, however, are disadvantageous if flexible substrates are to be used as carriers. Flexible substrates, for example polymer films, are, however, of essential significance for the production of flexible components comprising ZnO-containing layers.

Fleischhaker et al., J. Mater. Chem., 2010, 20, 6622-6625, describe an alternative approach for preparation of ammoniacal solutions of zinc hydroxide compounds. This involves dissolving commercially available ZnO in aqueous ammonia solution. ZnO-containing layers obtainable therefrom at conversion temperatures of 150° C., however, do not have sufficiently good electrical properties (especially field-effect mobilities, switch-on voltages and hysteresis characteristics).

Schmechel et al., Thin Solid films 2011, 519, 5623-5628 describe the use of zinc oxide hydrate in ammoniacal solution in the synthesis of ZnO-containing layers, and field-effect transistors produced at conversion temperatures of 125, 300 and 500° C. The electrical properties thereof (especially field-effect mobilities, switch-on voltages and hysteresis characteristics), however, are still not satisfactory.

Moon et al., J. Mater. Chem., 2011, 21, 13524 describe yttrium-doped ZnO transistors which are produced from ammoniacal formulations comprising hydroxozinc compounds and $Y(OH)_3$. The Y-doped layers described, however, exhibit poorer values than non-Y-doped layers in terms of electrical properties, especially in terms of field-effect mobilities. Moreover, the conversion temperatures required are unusable for the desired purposes.

It is thus an object of the present invention to provide, with respect to the known prior art, systems with which the existing approaches for production of ZnO-containing layers from precursor-based systems can be improved to the effect that, even at low processing temperatures, ZnO-containing layers with good electrical properties, especially with high electron mobilities $\mu_{FET}$, favourable hysteresis and a favourable switch-on voltage are the result. Favourable hysteresis is understood to mean a value for the quantification of the path dependence of a measurement, i.e. the difference between measured voltage between "outward route" and "return route", which should be at a minimum. The hysteresis can be determined for a particular drain current (here: $1 \cdot 10^{-8}$ A) as the difference in the gate voltage between the outward curve and the return curve as the horizontal line between the two intersections with the transfer characteristic. The switch-on voltage is understood to mean the voltage between gate and source at which the transistor switches on, i.e. starts to conduct electrical current between source and drain. This value should be as close as possible to 0 V.

The present object is achieved by the inventive ammoniacal formulation comprising a) at least one hydroxozinc compound and b) at least one compound of a main group 3 element.

An ammoniacal formulation comprising at least one hydroxozinc compound is understood to mean an aqueous ammonia-containing composition in which a hydroxozinc compound has been dissolved or in which a hydroxozinc compound has been formed from non-hydroxozinc compounds. Corresponding hydroxozinc compounds may have one or more complex atoms which are essentially zinc. The ammoniacal formulation preferably has only a single hydroxozinc compound. Preferably, since this leads to particularly good and homogeneous layers, the hydroxozinc compound has only a single central ion which is zinc. In addition, the hydroxozinc compound has hydroxo groups (=—OH groups) as ligands. Corresponding hydroxozinc compounds may additionally accept ammine ligands ($NH_3$ ligands). The hydroxozinc compound may have further ligands in addition to the central Zn ion(s) and the hydroxo and optionally ammine ligands. Preferably, because this leads to layers having particularly good electrical properties, the hydroxozinc compound has exclusively hydroxo and optionally ammine ligands.

The at least one hydroxozinc compound may be in dissociated and optionally solvated or dispersed form in the ammoniacal formulation.

Because they are particularly suitable for production of homogeneous layers with particularly good electrical properties, particular preference is given to ammoniacal solutions of zinc hydroxide compounds which contain a Zn-ammine-hydroxo complex of the generic formula $Zn(OH)_x (NH_3)_y^{(2-x)+}$ where $1 \leq x \leq 2$ and $1 \leq y \leq 6$. Corresponding formulations can be prepared from zinc nitrate solutions via basic precipitation with a hydroxide base, for example NaOH, and subsequent dissolution of the resulting precipitate in ammoniacal water.

The inventive formulation comprises the at least one hydroxozinc compound preferably in proportions of 50 to 99.95 mol %, preferably of 85 to 99.95 mol %, more preferably of 95 to 99.95 mol %, based on the total amount of zinc ions and atoms/ions of the main group 3 element.

The inventive formulation additionally comprises at least one compound of a main group 3 element. The formulation thus comprises at least one compound of an element selected from the group consisting of boron (B), aluminium (Al), gallium (Ga), indium (In) and thallium (Tl). The results are particularly good when the main group 3 element is in trivalent form. Particularly good results are achieved when the at least one compound of a main group 3 element is a compound of aluminium (Al), gallium (Ga) or indium (In).

The at least one compound of the main group 3 element may be dissociated and optionally solvated or dispersed in the ammoniacal formulation.

Preferably, because this leads to particularly good electrical properties of the ZnO-containing layers producible with the aid of corresponding compositions, the ammoniacal formulation comprises at least two compounds of main group 3 elements. These are further preferably compounds of different main group 3 elements. Very particularly good results are achieved when the formulation comprises at least one gallium compound and at least one indium compound.

The inventive formulation comprises the at least one compound of a main group 3 element preferably in proportions of 0.05 to 50 mol %, preferably of 0.05 to 15 mol %, more preferably of 0.05 to 5 mol %, based on the total molar amount of zinc ions and atoms/ions of the main group 3 element.

If two or more compounds of main group 3 elements are present in the formulation, the respective proportions thereof are preferably 1 to 99 mol %, preferably 5 to 95 mol %, based on the total molar amount of the compounds of main group 3 elements used.

Particular preference is given to ammoniacal formulations which, as well as the hydroxozinc compound, also comprise at least one compound of indium and at least one compound of gallium. Further preferably, the ratio of the total molar amounts of the compounds of main group 3 elements used based on the molar amount of gallium and indium atoms present therein, is 50 to 99 mol %, preferably 66 to 95 mol % and more preferably 75 to 90 mol % for the gallium compounds, and 1 to 50 mol %, preferably 5 to 33 mol % and more preferably 10 to 25 mol % for the indium compounds.

If at least one gallium compound and at least one indium compound is present in the formulation, the formulation is particularly suitable for production of zinc oxide-containing layers with particularly good electrical properties when the hydroxozinc compound is present in proportions of 65-75 mol %, the gallium compound in proportions of 25-34 mol % and the indium compound in proportions of 1-10 mol % based on the total amount of zinc ions and atoms/ions of the main group 3 element.

Compounds of main group 3 elements with particularly good usability are the corresponding nitrates, hydroxides, oxides, oxide hydroxides, halides and oxide halides. With very particular preference, it is possible to use the nitrates, hydroxides, oxides, oxide hydroxides, halides or oxide halides of aluminium, indium or gallium.

The best ZnO-containing layers result when formulations producible a) by dissolving the nitrate salts of zinc and at least one main group 3 element in the trivalent oxidation state, b) precipitating a hydroxide-containing solid with a hydroxide base, c) removing the solvent, optionally c') washing, and d) taking up the precipitate in ammoniacal water are used. The hydroxide bases usable are preferably the bases NaOH and KOH. The removal can preferably be effected by means of filtration or centrifugation. When the precipitate is taken up in ammoniacal water, this may go into solution fully or partly. The concentration of the ammonia in the aqueous ammonia formulation which takes up the precipitate is preferably 20 to 33% by weight, preferably 25 to 30% by weight, based on the total mass of ammonia and water. Full dissolution, however, is not necessary for the executability of the present invention. In addition, steps c), c') and d) can be repeated once or more than once to achieve particularly good layers.

Preferably, the total concentration of zinc ions and main group 3 element atoms/ions for achievement of particularly good results is 0.05 to 2, preferably 0.1 to 1 and more preferably 0.1 to 0.5 mol/l.

The inventive formulation is outstandingly suitable for production of ZnO-containing layers without any need to add further additives thereto for this purpose. Nevertheless, the inventive formulations are compatible with various additives, for example substances which stabilise them against reagglomeration and sedimentation. In general, this at least one additive, depending on the type, the concentration of hydroxozinc compound and the nature of the liquid phase of the dispersion, may be present in a proportion of 0.01 to 20% by weight based on the hydroxozinc compounds present in the formulation. In general, a low proportion of these substances will be the aim, since this can have positive effects on the performance of the electronic component. Particularly suitable additives are:

I) Styrene oxide-based polyalkylene oxide with random distribution or as a block copolymer of the general formula (1), $$R^1O(SO)_a(EO)_b(PO)_c(BO)_dR^2 \quad (1)$$

where
$R^1$=a straight-chain or branched or cycloaliphatic radical having 8 to 13 carbon atoms,
$R^2$=hydrogen, an acyl radical, alkyl radical or carboxylic acid radical having in each case 1 to 8 carbon atoms,
SO=styrene oxide, EO=ethylene oxide, PO=propylene oxide,
BO=butylene oxide and
a=1 to 5,
b=3 to 50,
c=0 to 3,
d=0 to 3, where b≥a+c+d.

Compounds where a=1 to 1.9 are described, for example, in EP 1078946 A1.

II) A phosphoric ester of the general formula (2)

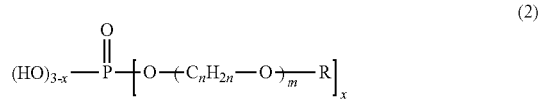

where R=

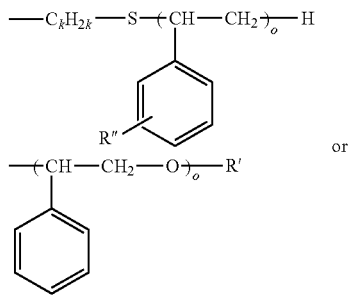

where
x=1 or 2,
n=2 to 18,
m, o=2 to 100,
k=2 to 4,
R"=H or a linear or branched alkyl radical which may optionally be substituted by additional functional groups, and
R'=alkyl, alkaryl, alkenyl or sulphopropyl radical.

Compounds used with preference are described, for example, in EP 940406 A1.

III) In addition, it is possible to use block copolymers and salts thereof of the general formula (3)

$$[R^1O(SO)_a(EO)_b(CH_2CHCH_3O)_c(BO)_d]_xP(=O)(OH)_{3-x} \quad (3)$$

where
$R^1$=a straight-chain, branched or cycloaliphatic radical having 1 to 22 carbon atoms,
SO=styrene oxide, EO=ethylene oxide, BO=butylene oxide and
a=1 to <2,
b=0 to 100,
c=0 to 10,
d=0 to 3, where b≥a+c+d.

IV) In addition, it is possible to use compounds which are obtainable by the partial or complete reaction of:
A) one or more amino-functional polymers with
B) one or more polyesters of the general formulae (4)/(4a)

$$T\text{-}C(O)\text{---}[O\text{-}A\text{-}C(O)]_x\text{---}OH \quad (4),$$

$$T\text{-}O\text{---}[C(O)\text{-}A\text{-}O\text{-}]_y\text{---}Z \quad (4a) \text{ and}$$

C) one or more polyethers of the general formula (5)/(5a)

$$T\text{-}C(O)\text{---}B\text{---}Z \quad (5),$$

$$T\text{-}O\text{---}B\text{---}Z \quad (5a), \text{ in which}$$

T is a hydrogen radical and/or an optionally substituted, linear or branched aryl, arylalkyl, alkyl or alkenyl radical having 1 to 24 carbon atoms,
A is at least one divalent radical selected from the group of the linear, branched, cyclic and aromatic hydrocarbons,
Z is at least one radical selected from the group of the sulphonic acids, sulphuric acids, phosphonic acids, phosphoric acids, carboxylic acids, isocyanates, epoxides, especially of phosphoric acid and (meth)acrylic acid,
B is a radical of the general formula (6)

$$\text{---}(C_lH_{2l}O)_a\text{---}(C_mH_{2m}O)_b\text{---}(C_nH_{2n}O)_c\text{---}(SO)_d\text{---} \quad (6)$$

a, b, c are each independently values of 0 to 100, with the proviso that the sum of a+b+c is ≥0, preferably 5 to 35, especially 10 to 20, with the proviso that the sum of a+b+c+d>0, d is ≥0, preferably 1 to 5, l, m, n are each independently ≥2, preferably 2 to 4, x, y are each independently ≥2.

V) In addition, it is possible to use organopolysiloxanes of the general formula (7)

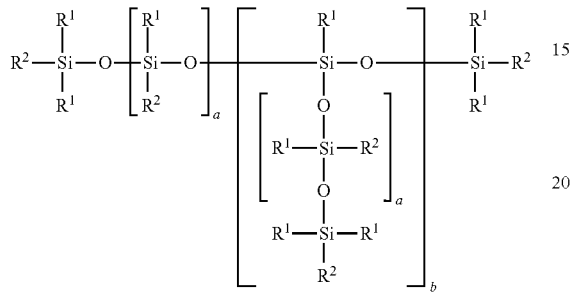

(7)

where the radicals

R$^1$ are alkyl radicals having 1 to 4 carbon atoms or aryl radicals, but at least 80% of the R$^1$ radicals are methyl radicals, R$^2$ in the molecule are the same or different and may be defined as follows a)

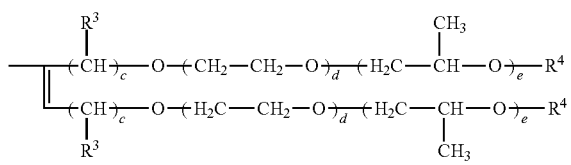

in which

R$^3$ is a hydrogen or alkyl radical,

R$^4$ is a hydrogen, alkyl or carboxyl radical, c is from 1 to 20, d is from 0 to 50, e is from 0 to 50, or b) —(CH$_2$—)$_f$OR$^5$ in which R$^5$ is a hydrogen, alkyl, carboxyl radical, or a dimethylolpropane radical optionally containing ether groups, f is from 2 to 20 or c) —(CH$_2$—)$_g$(OC$_2$H$_4$—)$_h$(OC$_3$H$_6$—)$_i$(OC$_4$H$_8$)$_j$(OCH$_2$CH(C$_6$H$_5$))$_k$OR$^6$ in which R$^6$ is a hydrogen, alkyl or carboxyl radical, g is from 2 to 6, h is from 0 to 20, i is from 1 to 50, j is from 0 to 10, k is from 0 to 10 or d) corresponds to the R$^1$ radical, with the proviso that, in the average molecule, at least one R$^2$ radical is defined as (a), where a is from 1 to 500, preferably 1 to 200 and especially 1 to 50, and b is from 0 to 10, preferably <5 and especially 0.

Such compounds are described, for example, in EP 1382632 A1.

VI) In addition, it is possible to use copolymers based on styrene oxide-based oxyalkylene glycol alkenyl ethers or polyalkylene oxide alkenyl ethers and unsaturated carboxylic acid derivatives, preferably dicarboxylic acid derivatives, with a) 1 to 80 mol % of at least one of the constituent groups of the formula (8a), (8b), (8c) and/or (8d)

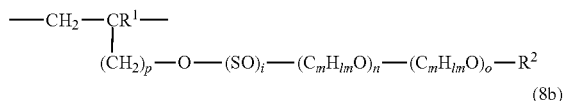

(8a)

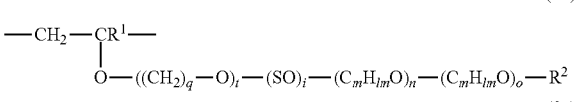

(8b)

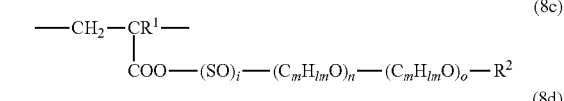

(8c)

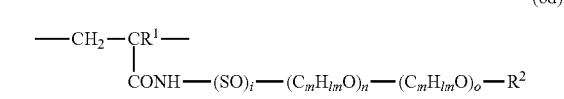

(8d)

in which

R$^1$=H, aliphatic hydrocarbyl radical having 1 to 5 carbon atoms, p=1-4, q=0-6, t=0-4, i=1-6, l=1-2, m=2-18, where the index on the hydrogen atom is formed by the product of l and m, n=0-100, o=0-100, SO=styrene oxide, where (SO)$_i$ and the alkylene oxide derivatives may be in random or blockwise distribution in the polyether, but the groups are preferably present in blockwise structure and in the sequence

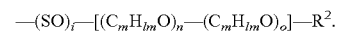

R$^2$=H, an aliphatic, optionally branched hydrocarbyl radical having 1 to 20 carbon atoms, a cycloaliphatic hydrocarbon having 5 to 8 carbon atoms, an aryl radical which has 6 to 14 carbon atoms and is optionally substituted, or may be a phosphoric ester (preferably monoester), sulphate or sulphonate derivative.

b) 1 to 90 mol % of constituent groups of the formula (9)

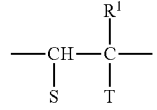

(9)

where

S=—H, —COOM$_a$, —COOR$^3$,

M=hydrogen, mono- or divalent metal cation, ammonium ion, organic amine radical, a=1 or, in the case that M is a divalent metal cation, ½, R$^3$=an aliphatic, optionally branched hydrocarbyl radical having 1 to 20 carbon atoms, a cycloaliphatic hydrocarbon having 5 to 8 carbon atoms, an aryl radical having 6 to 14 carbon atoms, $T=-U^1-R^4$ or $-U^1-(C_mH_{lm}O)_n-(C_mH_{lm}O)_o-R^2$,
$U^1=-COO-$, $-CONH-$, $-CONR^3-$, $-O-$, $-CH_2O-$,
$R^4=H$, $M_a$, $R^3$ or $-Q^1-NQ^2Q^3$,
where
$Q^1$ is a divalent alkylene radical having 2 to 24 carbon atoms,
$Q^2$ and $Q^3$ are each aliphatic and/or alicyclic alkyl radicals having 1 to 12 carbon atoms, optionally oxidized to
$-Q^1-N^{(+)}O^{(-)}Q^2Q^3$
and
m, n, l, o, $R^1$ and $R^2$ are each as defined above, c) 0 to 10 mol % of constituent groups of the formula (10)

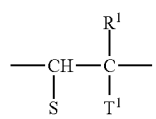

(10)

where
$T^1=-U^1-(C_mH_{lm}O)_n-(C_mH_{lm}O)_o-R^5$,

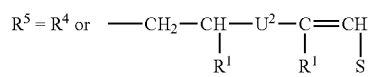

where $U^2=-OOC-$, $-NHOC-$, $-O-$, $-CH_2-$,
where m, n, l, o, S, $R^1$, $R^2$ and $U^1$ are each as defined above.

Such compounds are described, for example, in DE 10348825 A1.

(VII) In addition, it is possible to use polyacrylic acids having a weight-average molecular weight $M_w$ of preferably 200 to 2 000 000 g/mol, more preferably an $M_w$ of 1000 to 50 000 g/mol, and salts thereof.

The inventive formulation can additionally be used to produce ZnO-containing layers not only directly, with or without addition of additives; instead, the formulation can also be used embedded in matrix formers, for example PMMA, polystyrene, PP, PE, PC or PVC, for the production of ZnO-containing layers.

The inventive formulation is an aqueous formulation. To achieve positive properties, however, one or more further solvents may be present in the formulation in amounts typical for solvents or for additives.

These are preferably organic solvents, especially alcohols, ethers and ethoxy alcohols. Particular preference is given to secondary and tertiary alcohols. These substances are particularly suitable as additives for achievement of formulations of good printability.

The invention further provides a process for producing a ZnO-containing layer, in which an inventive formulation is applied to a substrate and then thermally converted, and to the ZnO-containing layers producible by this process. Corresponding layers are preferably semiconductive. The way in which the person skilled in the art can control the formation of semiconductive layers is known.

The substrate may be an Si or Si/SiO$_2$ wafer, a glass substrate or a polymer substrate (especially a polymer film), the latter especially based on PET, PE, PEN, PEI, PEEK, PI, PC, PEA, PA or PP.

The application of the inventive formulation to the substrate can be effected by dip coating, slot-die coating, spincoating, spray application or various printing processes (flexographic printing, gravure printing, inkjet printing, screen printing, pad printing or offset printing).

The thermal conversion is effected preferably at temperatures of 120 to 450° C., further preferably 125 to 400° C. Very particular preference is given to effecting the thermal conversion at temperatures of 125 to 300° C. The thermal conversion can be effected by the use of hotplates, ovens, lasers and UV and/or microwave radiation. The great advantage of the present invention is that the choice of a low processing temperature of up to 300° C. enables the use of polymer substrates, especially polymer films.

After thermal conversion, the ZnO-containing layer produced from the inventive formulation can be aftertreated. For instance, the properties of the ZnO-containing layer produced can be improved further by an aftertreatment with reducing or oxidising atmospheres, or by means of moisture, plasma treatment, laser treatment, UV irradiation.

The inventive formulations can preferably be used for production of electronic components. More particularly, the inventive formulations are suitable for the production of transistors—especially TFTs—optoelectronic components and sensors. Especially TFTs which are produced using the inventive formulations are particularly suitable for use in LCDs or in integrated circuits for RFID tags.

The present invention thus likewise provides an electronic component, especially a transistor, an optoelectronic component and a sensor, each of which comprises at least one, preferably semiconductive, ZnO-containing layer which has been produced by the processes described above.

EXAMPLES

Inventive Example 1

Nitrate salts of zinc, of gallium and of indium in a molar ratio of 66.5:28.5:5 are used to make up 15 ml of a solution of overall concentration 0.5 mol/l with fully demineralised water. Subsequently, a precipitation is effected with 10 ml of 2.5 mol/l NaOH. The precipitate is removed by centrifugation (4500 rpm, 10 minutes) and the liquid phase is discarded. The precipitate is dispersed in fully demineralised water, stirred and centrifuged again. Subsequently, the liquid phase is discarded. This step is repeated four times more. Finally, the remaining precipitate is stirred in 28% aqueous ammonia solution for at least 1 h to form a saturated solution.

Inventive Example 2

Nitrate salts of zinc and of gallium in a molar ratio of 70:30 are used to make up 15 ml of a solution of overall concentration 0.5 mol/l with fully demineralised water. Subsequently, a precipitation is effected with 10 ml of 2.5 mol/l NaOH. The precipitate is removed by centrifugation (4500 rpm, 10 minutes) and the liquid phase is discarded. The precipitate is dispersed in fully demineralised water, stirred and centrifuged again. Subsequently, the liquid phase is discarded. This step is repeated four times more. Finally, the remaining precipitate is stirred in 28% aqueous ammonia solution for at least 1 h to form a saturated solution.

Comparative Example 3

The nitrate salt of zinc is used to make up 15 ml of a solution of overall concentration 0.5 mol/l with fully demineralised water. Subsequently, a precipitation is effected with 10 ml of 2.5 mol/l NaOH. The precipitate is removed by centrifugation (4500 rpm, 10 minutes) and the liquid phase is discarded. The precipitate is dispersed in fully demineralised water, stirred and centrifuged again. Subsequently, the liquid phase is discarded. This step is repeated four times more. Finally, the remaining precipitate is stirred in 28% aqueous ammonia solution for at least 1 h to form a saturated solution.

Silicon wafers with an $SiO_2$ layer of thickness 230 nm and pre-structured source and drain contacts made from ITO are coated with the solutions according to Example 1, 2 or 3 by means of spin-coating (100 µl, 3000 rpm, 30 s). Subsequently, the respective layer is heat-treated at 160° C. TFTs produced using the resulting layers and having bottom-gate and bottom-contact configuration have the electrical data listed in Table 1:

TABLE 1

| | $Zn^{2+}:Ga^{3+}:In^{3+}$ (starting weight) | $Zn^{2+}:Ga^{3+}:In^{3+}$ (in formulation) | Mobility [cm$^2$/Vs] | Hysteresis [V] | $V_{on}$ [V] |
|---|---|---|---|---|---|
| Example 1 | 66.5:28.5:5 | 99.4:0.1:>0 | 0.62 | 2.5 | 3 |
| Example 2 | 70:30 | 99.9:0.1 | 0.31 | 2 | 3 |
| Example 3 | 100 | 100 | 0.21 | 3 | 6 |

The invention claimed is:

1. An ammoniacal formulation, comprising:
 a) a hydroxozinc compound, and
 b) at least two compounds of main group 3 elements
 wherein the hydroxozinc compound is $Zn(OH)_x(NH_3)_y^{(2-x)+}$, where $1 \leq x \leq 2$ and $1 \leq v \leq 6$,
 wherein the at least two compounds of the main group 3 elements are a gallium compound and an indium compound, and
 wherein the formulation comprises, based on a total amount of zinc and the main group 3 elements, from 65-75 mol % of the hydroxozinc compound, from 25-34 mol % of the gallium compound, and from 1-10 mol % of the indium compound.

2. The formulation according to claim 1, which is obtained by a process comprising
 a) dissolving nitrate salts of zinc and at least two main group 3 elements in a trivalent oxidation state in a solvent,
 b) precipitating a hydroxide-containing solid with a hydroxide base,
 c) removing the solvent, thereby obtaining a precipitate, and
 d) taking up the precipitate in ammoniacal water.

3. A process for producing a ZnO-containing layer, the process comprising:
 applying the formulation according to claim 1 to a substrate, and
 then thermally converting the formulation, thereby obtaining the ZnO-containing layer.

4. A process for producing an electronic component, the process comprising:
 employing the formulation according to claim 1 to produce the electronic component.

5. An electronic component, comprising a ZnO-containing layer produced by the process according to claim 3.

6. The electronic component according to claim 5, which is a transistor.

7. The electronic component according to claim 5, which is an optoelectronic component.

8. The electronic component according to claim 5, which is a sensor.

* * * * *